(12) United States Patent
Park et al.

(10) Patent No.: US 12,666,852 B2
(45) Date of Patent: Jun. 23, 2026

(54) DISPLAY DEVICE HAVING IMPROVED HEAT RADIATING PERFORMANCE

(71) Applicant: Samsung Display Co., Ltd., Yongin-si (KR)

(72) Inventors: Byoungkyoo Park, Yongin-si (KR); Yongil Kim, Yongin-si (KR); Wee-Joon Jeong, Yongin-si (KR); Jangun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 331 days.

(21) Appl. No.: 18/189,959

(22) Filed: Mar. 24, 2023

(65) Prior Publication Data

US 2024/0016043 A1 Jan. 11, 2024

(30) Foreign Application Priority Data

Jul. 7, 2022 (KR) ........................ 10-2022-0083622

(51) Int. Cl.
*H10K 59/80* (2023.01)
*H10H 20/858* (2025.01)

(52) U.S. Cl.
CPC ..... *H10K 59/8794* (2023.02); *H10H 20/8581* (2025.01); *H10H 20/8582* (2025.01)

(58) Field of Classification Search
None
See application file for complete search history.

(56) References Cited

U.S. PATENT DOCUMENTS

| | | | |
|---|---|---|---|
| 7,160,619 B2 | 1/2007 | Clovesko et al. | |
| 7,276,273 B2 | 10/2007 | Clovesko et al. | |
| 2016/0291397 A1 | 10/2016 | Pyo et al. | |
| 2017/0367214 A1* | 12/2017 | Stellman | H10K 50/87 |
| 2018/0263138 A1* | 9/2018 | Wu | H05K 7/2099 |
| 2019/0320550 A1 | 10/2019 | Hou et al. | |
| 2020/0045826 A1* | 2/2020 | Wang | H10K 50/87 |
| 2021/0337700 A1 | 10/2021 | Jung et al. | |
| 2022/0104400 A1 | 3/2022 | Goto et al. | |

FOREIGN PATENT DOCUMENTS

| | | |
|---|---|---|
| JP | 2022-044692 A | 3/2022 |
| KR | 10-2016-0117026 A | 10/2016 |
| KR | 10-2390901 B1 | 4/2022 |

* cited by examiner

*Primary Examiner* — Daniel Whalen
(74) *Attorney, Agent, or Firm* — Womble Bond Dickinson (US) LLP

(57) ABSTRACT

A display device includes: a display panel having a display region and a non-display region; and a heat radiating member attached to the display panel, wherein the heat radiating member includes: a first plate facing the display panel; a second plate configured to face the first plate and defining an inner space with the first plate; and a phase change material in the inner space, and wherein the inner space includes a plurality of divided spaces, and the phase change material is in the plurality of divided spaces.

18 Claims, 11 Drawing Sheets

DISPLAY DEVICE HAVING IMPROVED HEAT RADIATING PERFORMANCE

CROSS-REFERENCE TO RELATED APPLICATIONS

The present application claims priority to and the benefit of Korean Patent Application No. 10-2022-0083622 filed on Jul. 7, 2022, in the Korean Intellectual Property Office, the entire disclosure of which is incorporated herein by reference.

BACKGROUND

Aspects of some embodiments of the present disclosure described herein relate to a display device having relatively improved heat radiating performance.

A display device includes a display panel including a plurality of pixels and a driver for driving the pixels. Heat generated from the display panel may affect user safety and may reduce or diminish the lifetime and image persistence of a light emitting element. Accordingly, studies have been conducted to lower the temperature of the display panel. For example, heat generated from the display panel may be transferred through a structure around the display panel and thereafter may be diffused to the surroundings from a surface of the display device through natural convection or radiation.

The above information disclosed in this Background section is only for enhancement of understanding of the background and therefore the information discussed in this Background section does not necessarily constitute prior art.

SUMMARY

Aspects of some embodiments of the present disclosure include a display device having relatively improved heat radiating performance.

According to some embodiments, a display device includes a display panel having a display region and a non-display region defined therein and a heat radiating member attached to the display panel. According to some embodiments, the heat radiating member includes a first plate that faces the display panel, a second plate that faces the first plate and defines an inner space with the first plate, and a phase change material in the inner space. According to some embodiments, the inner space includes a plurality of divided spaces, and the phase change material is in the plurality of divided spaces.

According to some embodiments, the plurality of divided spaces may include a first divided space and a second divided space spaced apart from the first divided space in a first direction. According to some embodiments, the phase change material may include a first phase change material in the first divided space and a second phase change material in the second divided space. According to some embodiments, the first divided space may have a larger volume than the first phase change material in a solid state, and the second divided space may have a larger volume than the second phase change material in a solid state.

According to some embodiments, the heat radiating member may further include a first partition wall that is between the first divided space and the second divided space and that extends in a second direction crossing the first direction, and the first partition wall may be coupled to the first plate and the second plate.

According to some embodiments, the second plate may include a first concave portion that defines the first divided space and a second concave portion that defines the second divided space, and a portion of the second plate between the first concave portion and the second concave portion may be coupled to the first plate.

According to some embodiments, the plurality of divided spaces may further include a third divided space spaced apart from the first divided space in a second direction crossing the first direction and a fourth divided space spaced apart from the third divided space in the first direction. According to some embodiments, the phase change material may further include a third phase change material in the third divided space and a fourth phase change material in the fourth divided space. According to some embodiments, the third divided space may have a larger volume than the third phase change material in a solid state, and the fourth divided space may have a larger volume than the fourth phase change material in a solid state.

According to some embodiments, a width of the first divided space in the first direction may be smaller than a width of the first divided space in a second direction crossing the first direction.

According to some embodiments, an entire region of the display region may overlap the inner space in a plan view.

According to some embodiments, the plurality of divided spaces may be completely separated from each other.

According to some embodiments, the plurality of divided spaces may be connected together and may be divided by a shape of the second plate.

According to some embodiments, the first plate may have a flat shape, and the second plate may have a curved shape.

According to some embodiments, a distance between the first plate and the second plate may be substantially the same in all regions.

According to some embodiments, a distance between the first plate and the second plate may be a first distance at a first point and may be a second distance greater than the first distance at a second point spaced apart from the first point.

According to some embodiments, the display panel may have a curved shape, the first plate may have a curved shape with a first curvature, and the second plate may have a curved shape with a second curvature greater than the first curvature.

According to some embodiments, a first protrusion that protrudes in a direction away from the first plate may be defined on the second plate, and the phase change material may be accommodated in the first protrusion.

According to some embodiments, in a plan view, the first protrusion may include a first side and a second side spaced apart from the first side in a first direction, and the first side and the second side may extend in a second direction crossing the first direction. According to some embodiments, a first length of the first side in the second direction may be greater than a second length of the second side in the second direction.

According to some embodiments, in a plan view, the first protrusion may have an inverted trapezoidal shape.

According to some embodiments, a second protrusion that protrudes in a direction away from the first plate and that is spaced apart from the first protrusion in the first direction, a third protrusion spaced apart from the second protrusion in the first direction, and a fourth protrusion spaced apart from the third protrusion in the first direction may be further defined on the second plate, and the phase change material may be accommodated in each of the second protrusion, the third protrusion, and the fourth protrusion.

According to some embodiments, the second protrusion and the third protrusion may be defined between the first protrusion and the fourth protrusion, and a gap between the second protrusion and the third protrusion may be greater than a gap between the third protrusion and the fourth protrusion.

According to some embodiments, a display device includes a display panel having a display region and a non-display region defined therein and a heat radiating member attached to the display panel. According to some embodiments, the heat radiating member includes a first plate that faces the display panel, a second plate that faces the first plate and defines an inner space with the first plate, and a phase change material in the inner space. According to some embodiments, the inner space includes a first divided space and a second divided space spaced apart from the first divided space in a first direction. According to some embodiments, the phase change material includes a first phase change material in the first divided space and a second phase change material in the second divided space. According to some embodiments, the first divided space has a larger volume than the first phase change material in a solid state, and the second divided space has a larger volume than the second phase change material in a solid state.

According to some embodiments, a display device includes a display panel having a display region and a non-display region defined therein and a heat radiating member attached to the display panel. According to some embodiments, the heat radiating member includes a first plate that faces the display panel, a second plate that faces the first plate and defines an inner space with the first plate, and a phase change material in the inner space. According to some embodiments, a first protrusion that protrudes in a direction away from the first plate is defined on the second plate. According to some embodiments, in a plan view, the first protrusion includes a first side and a second side spaced apart from the first side in a first direction. According to some embodiments, the first side and the second side extend in a second direction crossing the first direction. According to some embodiments, a first length of the first side in the second direction is greater than a second length of the second side in the second direction.

BRIEF DESCRIPTION OF THE DRAWINGS

The above and other characteristics and features of embodiments according to the present disclosure will become more apparent by describing in more detail aspects of some embodiments thereof with reference to the accompanying drawings.

4

Figure 8:
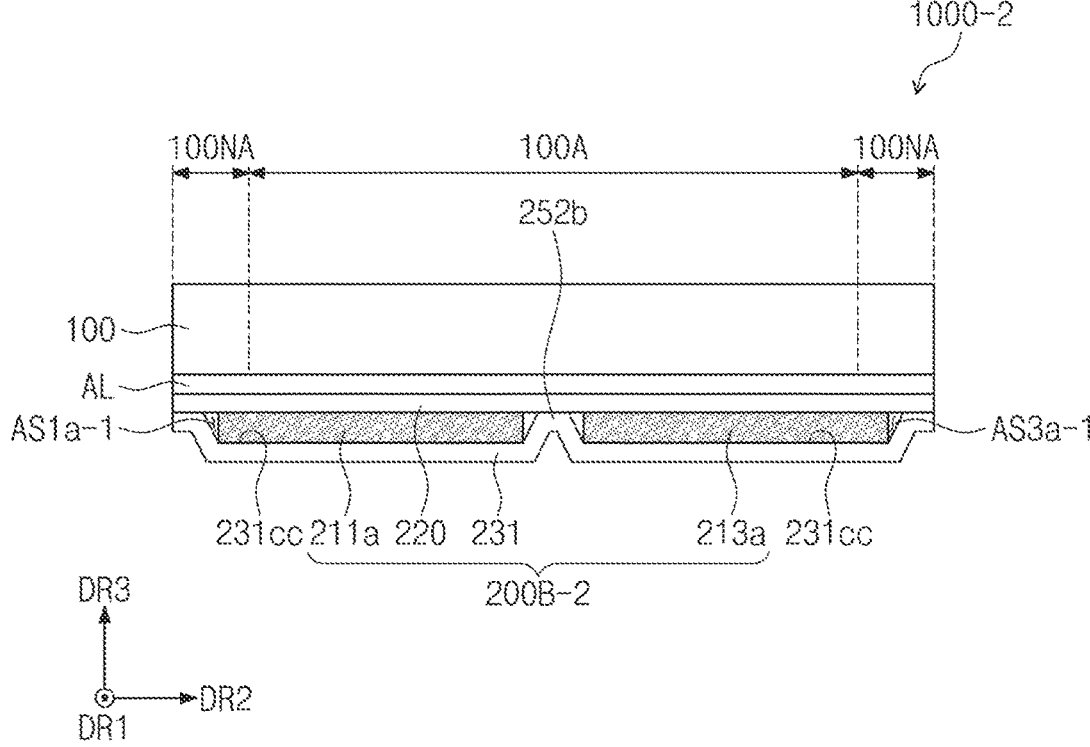

FIG. 8 is a sectional view of a display device according to some embodiments of the present disclosure.

Figure 9A:
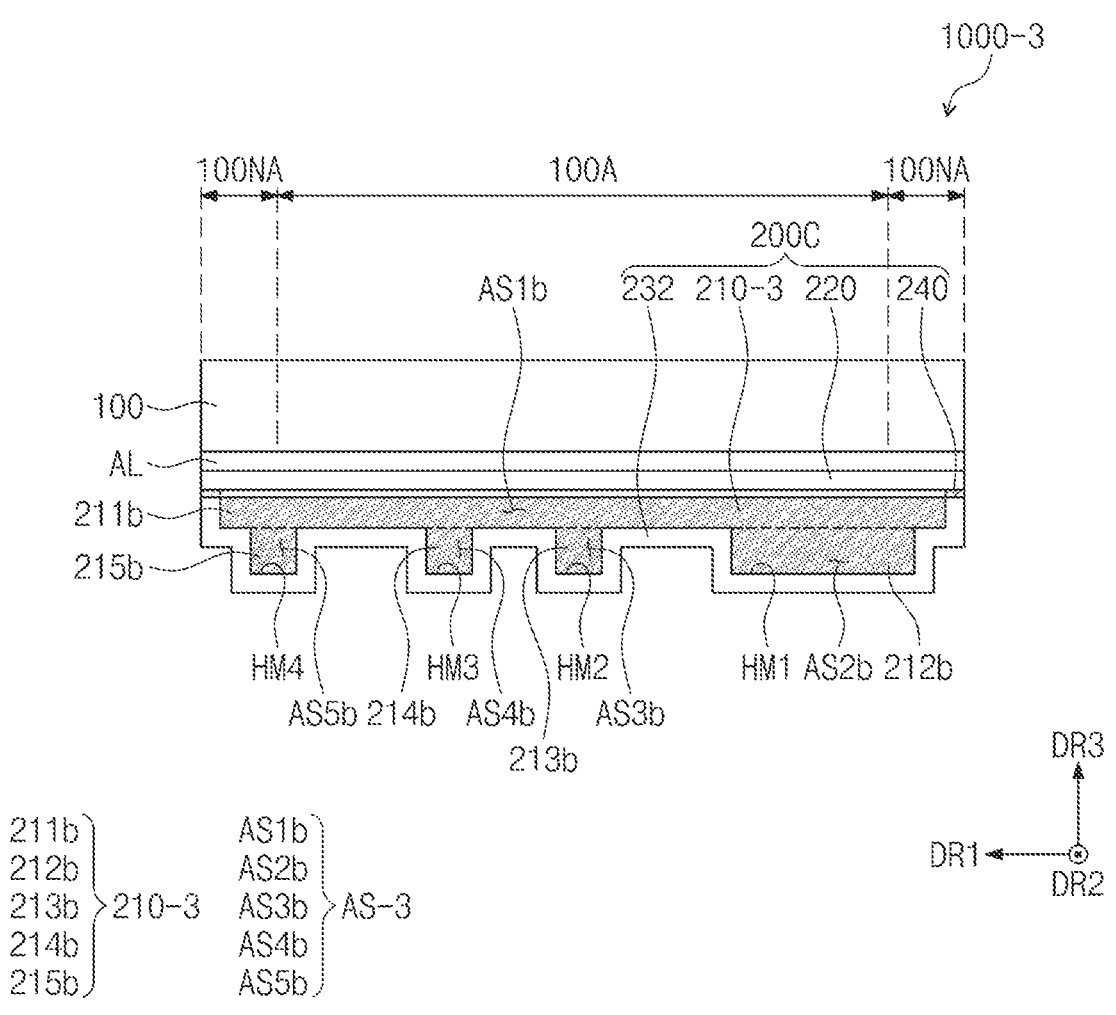

FIG. 9A is a sectional view of a display device according to some embodiments of the present disclosure.

Figure 9B:
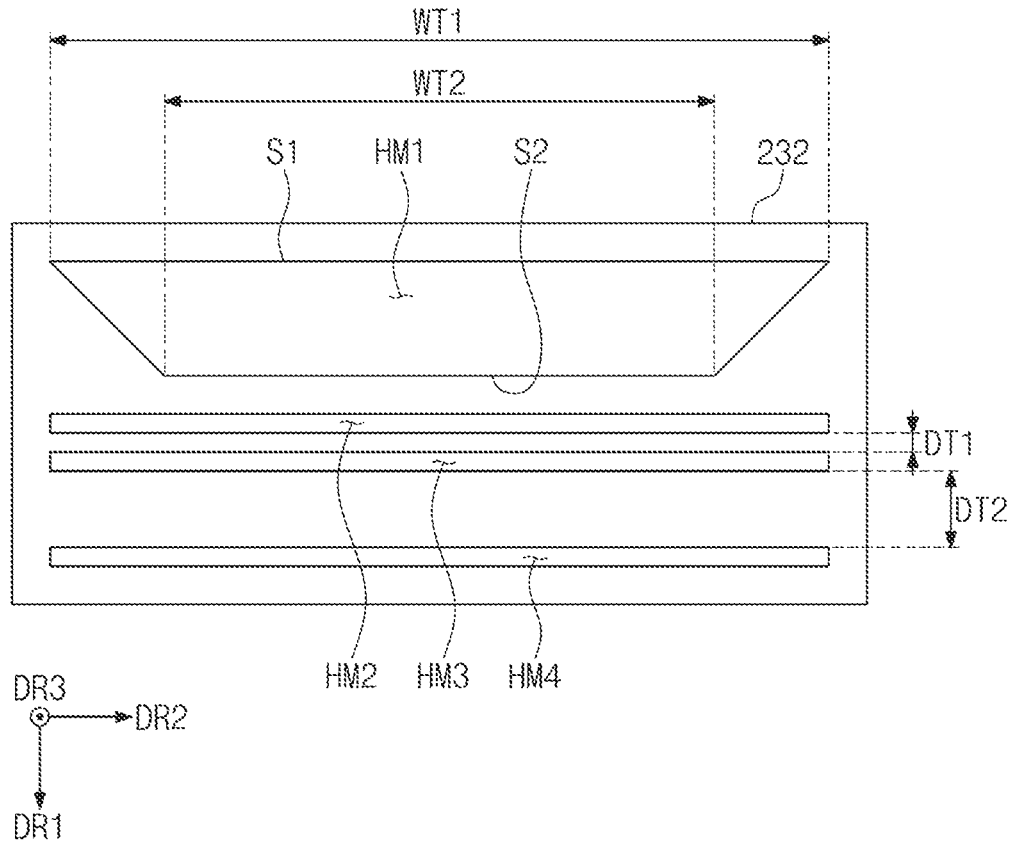

FIG. 9B is a plan view of a second plate according to some embodiments of the present disclosure.

Figure 10:
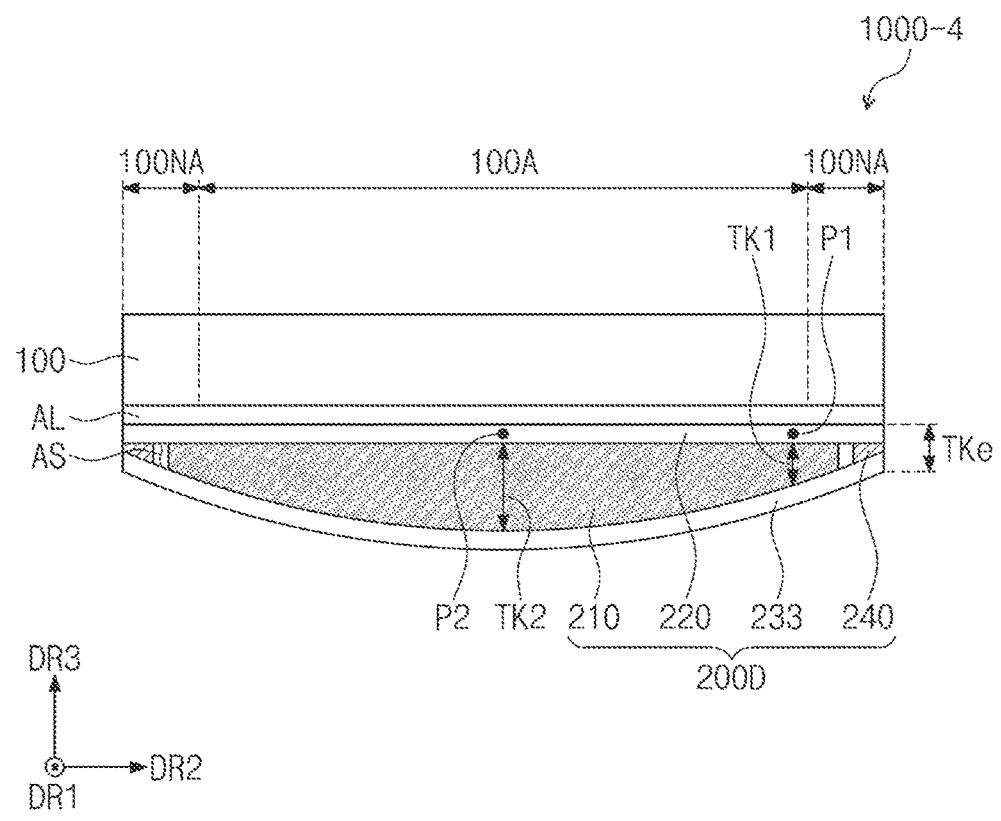

FIG. 10 is a sectional view of a display device according to some embodiments of the present disclosure.

Figure 11:
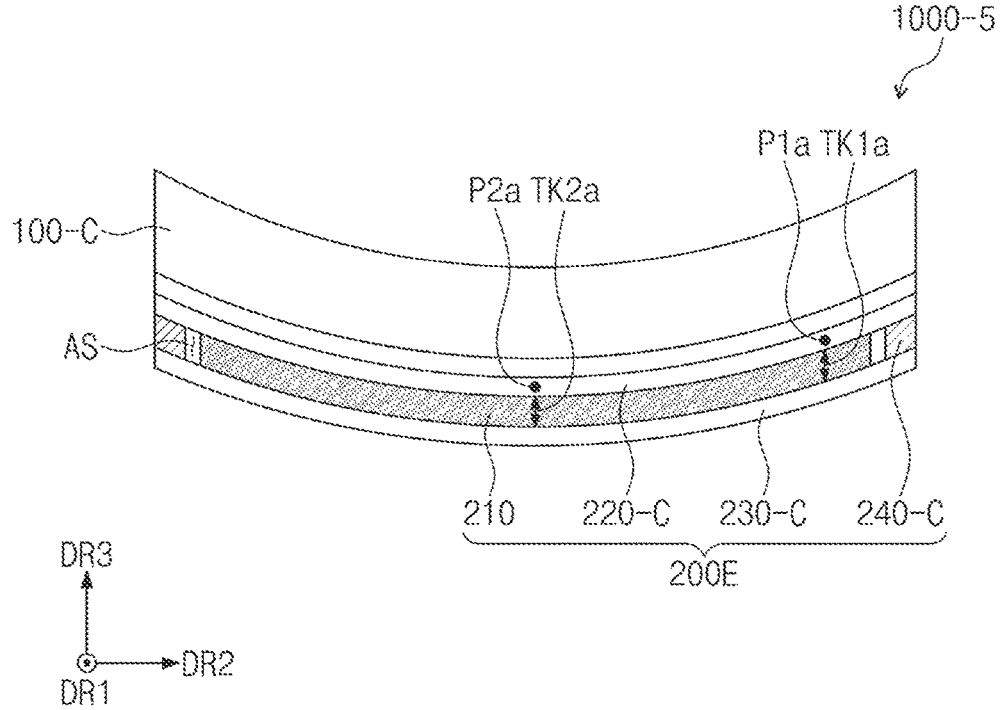

FIG. 11 is a sectional view of a display device according to some embodiments of the present disclosure.

Figure 12:
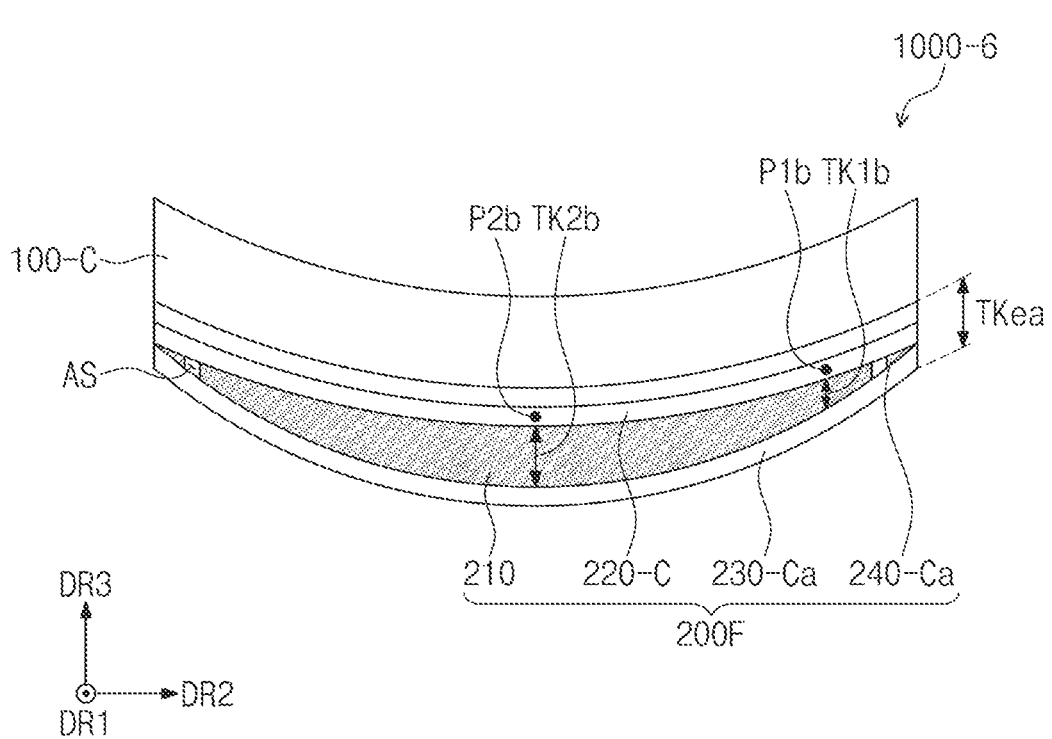

FIG. 12 is a sectional view of a display device according to some embodiments of the present disclosure.

Figure 13:
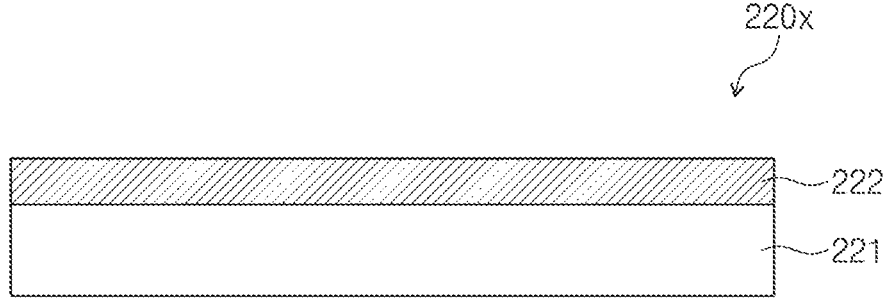

FIG. 13 is a sectional view of a first plate according to some embodiments of the present disclosure.

DETAILED DESCRIPTION

In this specification, when it is mentioned that a component (or, a region, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, aspects of some embodiments of the present disclosure will be described in more detail with reference to the accompanying drawings.

Figure 1:
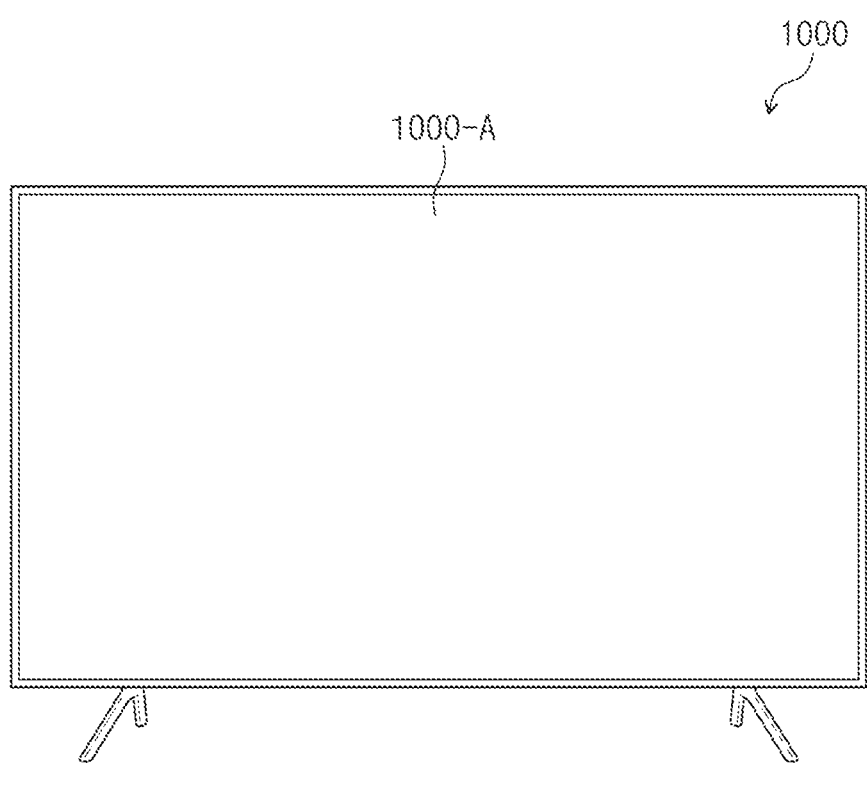
FIG. 1 is a plan view of a display device according to some embodiments of the present disclosure.
Figure 1:
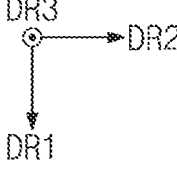

FIG. 1 is a plan view of a display device 1000 according to some embodiments of the present disclosure.

Referring to FIG. 1, the display device 1000 may be a device activated in response to an electrical signal. The display device 1000 may be applied to various products. For example, the display device 1000 may be applied to small and medium-sized electronic devices, such as a personal computer, a notebook computer, a personal digital assistant, a car navigation unit, a game machine, a portable electronic device, and a camera, as well as large electronic devices, such as a television, a monitor, and outdoor signage. The aforementioned examples are presented as embodiments, and the display device 1000 may be employed in other electronic devices without departing from the concept of the present disclosure. In FIG. 1, the display device 1000 is illustrated as a television.

The display device 1000 may display images in a third direction DR3 through a display surface 1000-A that is parallel to a plane defined by a first direction DR1 and a second direction DR2. The image may include a still image as well as a dynamic image. That is, the third direction DR3 may be a direction that is perpendicular or normal with respect to the display surface 1000-A or the plane defined by the first direction DR1 and the second direction DR2. The phrase "when viewed on a plane" or "in a plan view" as used in the present Specification and claims, refers to a view from a direction that is perpendicular to the plane defined by the first direction DR1 and the second direction DR2 or perpendicular to the display surface 1000-A.

Hereinafter, a direction substantially perpendicular to a plane defined by the first direction DR1 and the second direction DR2 is defined as the third direction DR3 Furthermore, as discussed above, the expression "on the plane" or "in a plan view" as used herein may mean that it is viewed in the third direction DR3.

Figure 2:
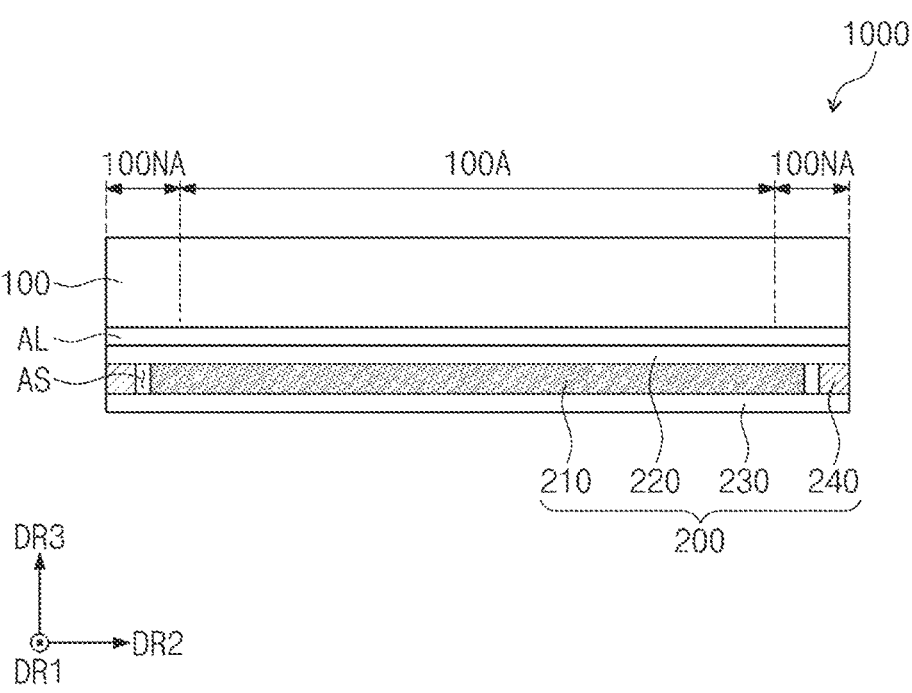
FIG. 2 is a sectional view of the display device according to some embodiments of the present disclosure.

FIG. 2 is a sectional view of the display device 1000 according to some embodiments of the present disclosure.

Referring to FIG. 2, the display device 1000 may include a display panel 100 and a heat radiating member 200.

A display region 100A and a non-display region 100NA may be defined in the display panel 100. The display region 100A may display images, and the non-display region 100NA may not display images. The non-display region 100NA may surround the display region 100A. That is, the non-display region 100NA may be in an area that is in a periphery (or outside a footprint) of the display region 100A. However, without being limited thereto, the shape of the display region 100A and the shape of the non-display region 100NA may be modified.

The display panel 100 may be a component that substantially generates images. The display panel 100 may be an emissive display panel. For example, the display panel 100 may be an organic light emitting display panel, an inorganic light emitting display panel, an organic-inorganic light emitting display panel, a quantum-dot display panel, a micro LED display panel, or a nano LED display panel.

The heat radiating member 200 may be attached to the display panel 100. The heat radiating member 200 may be attached to a rear surface of the display panel 100 through an adhesive layer AL. The heat radiating member 200 may include a phase change material 210, a first plate 220, and a second plate 230.

The first plate 220 may face the display panel 100. The first plate 220 may be attached to the display panel 100. The second plate 230 may face the first plate 220. The second plate 230, together with the first plate 220, may define an inner space AS. Both the first plate 220 and the second plate 230 may be flat. Accordingly, the distance between the first plate 220 and the second plate 230 may be substantially the same in all regions.

The first plate 220 and the second plate 230 may be coupled by a coupling member 240. Any material capable of coupling the first plate 220 and the second plate 230 may be used as the coupling member 240 without any specific limitation. For example, the coupling member 240 may be a normal adhesive. Alternatively, the coupling member 240 may be a welding point formed by welding the first plate 220 and the second plate 230. According to some embodiments, the coupling member 240 may form a chamber integrally connected with the first plate 220 and the second plate 230. The inner space AS may be completely sealed. Accordingly, even though the phase change material 210 is liquefied, the phase change material 210 may not be leaked to the outside.

The phase change material 210 may be located in the inner space AS. The phase change material 210 may include at least one of materials that experience a phase change in an operating temperature range of the display device 1000. For example, the display device 1000 may have an operating temperature range of about to about 50° C. The phase change material 210 may include at least one of an organic material, an inorganic material, or a eutectic mixture, or a mixture thereof. For example, the phase change material 210 may be provided by mixing an organic material and an inorganic material in an appropriate composition ratio.

Heat generated from the display panel 100 may be transferred to the phase change material 210 through the first plate 220. The phase change material 210 may absorb the heat of the display panel 100. Accordingly, the temperature of the display device 1000 may be suppressed from being raised to a phase change temperature or more despite a long period of operation.

Figure 3:
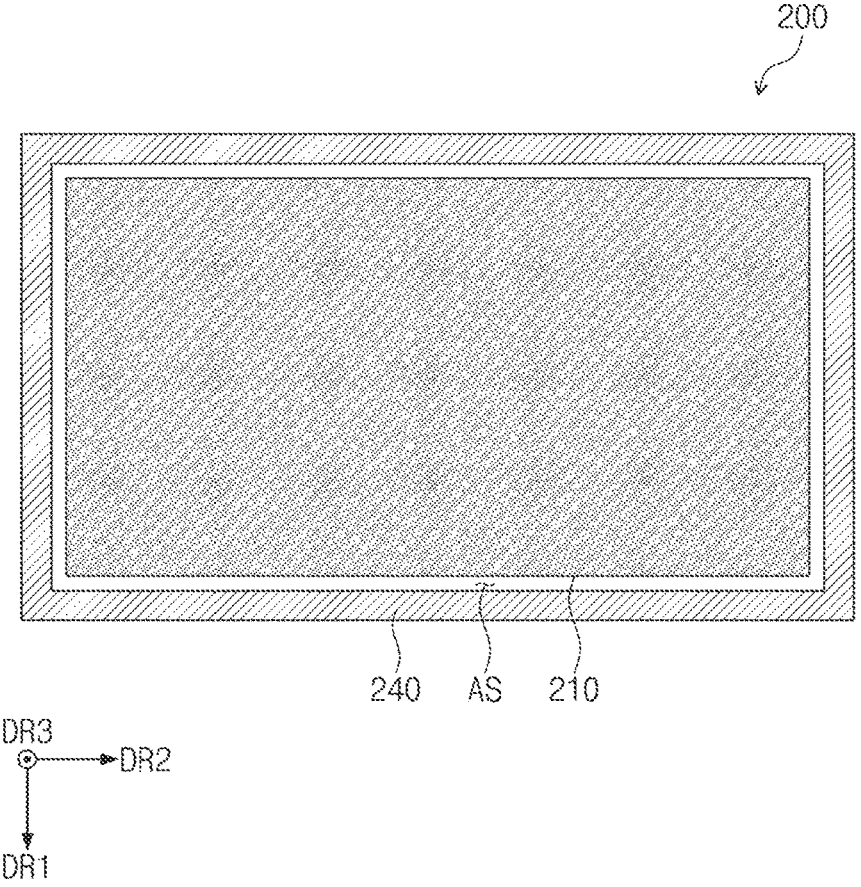
FIG. 3 is a plan view of a heat radiating member according to some embodiments of the present disclosure.
Figure 4:
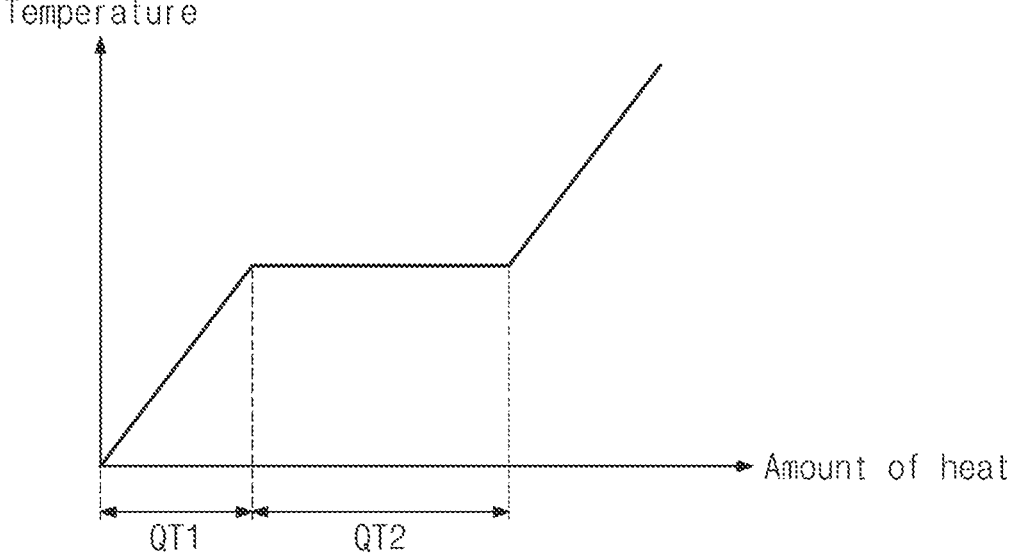
FIG. 4 is a graph depicting a temperature change depending on the amount of heat stored in a phase change material according to some embodiments of the present disclosure.

FIG. 3 is a plan view of the heat radiating member 200 according to some embodiments of the present disclosure. FIG. 4 is a graph depicting a temperature change depending on the amount of heat stored in the phase change material according to some embodiments of the present disclosure.

Referring to FIGS. 2, 3, and 4, the display region 100A of the display panel 100 may overlap the inner space AS in which the phase change material 210 is accommodated. When viewed on the plane (or in a plan view), an entire region of the display region 100A may overlap the inner space AS. For example, on the plane, the area of the inner space AS may be greater than the area of the display region 100A.

The volume of the inner space AS may be greater than the volume of the phase change material 210 in a solid state. For example, the volume of the inner space AS may be greater than the volume of the phase change material 210 in the solid state by about 10% or more. Accordingly, even though the phase change material 210 is changed from solid to liquid, the first and second plates 220 and 230 may not be deformed.

The phase change material 210 may generally have a low thermal conductivity. For example, the phase change material 210 may have a thermal conductivity of 1 W/mk or less. The first plate 220 coupled to the display panel 100 may have a higher thermal conductivity than the phase change material 210. For example, when the first plate 220 includes aluminum, the first plate 220 may have a thermal conductivity of 230 W/mk, when the first plate 220 includes copper, the first plate 220 may have a thermal conductivity of 390 W/mk, and when the first plate 220 includes steel, the first plate 220 may have a thermal conductivity of 45 W/mk.

The degree of thermal diffusion in plane directions, for example, the first direction DR1 and the second direction DR2 by the phase change material 210 may be less than the degree of thermal diffusion in the first direction DR1 and the second direction DR2 by the first plate 220. Thermal diffusion in the first direction DR1 and the second direction DR2 may be performed by the first plate 220.

That is, when the display panel 100 is driven, heat generated from the display panel 100 may be diffused in the first direction DR1 and the second direction DR2 through the first plate 220 in contact with the display panel 100. Furthermore, the heat diffused through the first plate 220 may be transferred to the phase change material 210, and the temperature of the display device 1000 may rise during a first period QT1. When the phase change material 210 reaches the phase change temperature, the phase change material 210 may experience a phase change during a second period QT2. Accordingly, a temperature rise of the display device 1000 may be suppressed during the second period QT2.

In the case of applying the 30-inch display panel 100 and the paraffin wax-based phase change material 210, it was identified through simulation that the temperature rise was suppressed for a period (e.g., a set or predetermined period) when the display panel 100 was driven at the maximum power consumption. The simulation was performed under the assumption that there is no external heat dissipation of the display panel 100 through convection and radiation.

Assuming that the phase change material 210 has a density of 0.8 g/ml and a latent heat of 250 J/g and the display panel 100 has a power consumption of 60 W, the total amount of heat for one hour may be 216 kJ. In this case, when the phase change material 210 has a thickness of 3 mm, the amount of heat that can be absorbed as the latent heat of the phase change material 210 may be 148 kJ, and when the display panel 100 is driven at the maximum power consumption, a temperature rise at the phase change temperature of the phase change material 210 may be suppressed for 41 minutes. When the phase change material 210 has a thickness of 5 mm, the amount of heat that can be absorbed as the latent heat of the phase change material 210 may be 248 kJ, and when the display panel 100 is driven at the maximum power consumption, a temperature rise at the phase change temperature of the phase change material 210 may be suppressed for 69 minutes. The thickness of the phase change material 210 may mean the thickness in the third direction DR3. The thickness of the phase change material 210 may correspond to the distance between the first plate 220 and the second plate 230 in the third direction DR3.

In general, actual use conditions (e.g., watching a video, using the Internet, playing a game, and the like), power consumption corresponds to ½ to ⅓ of the maximum power consumption. Furthermore, when the phase change material 210 reaches the phase change temperature, heat radiation through convection and radiation exists around the display panel 100, and there is a temperature rise delay effect due to the specific heats of the first plate 220 and the display panel 100. Accordingly, the temperature rise suppression time during actual driving may be longer.

Figure 5:
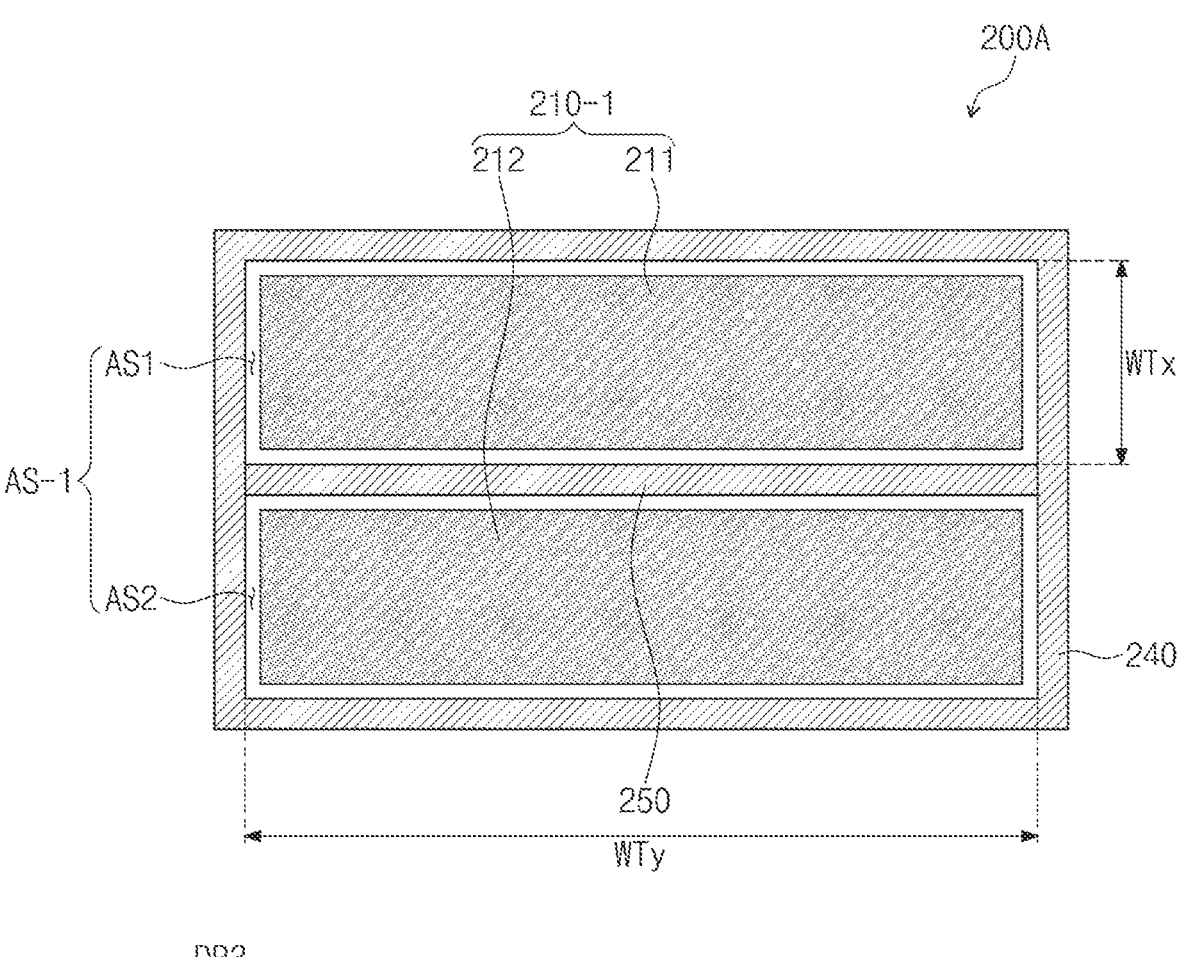
FIG. 5 is a plan view of a heat radiating member according to some embodiments of the present disclosure.
Figure 5:
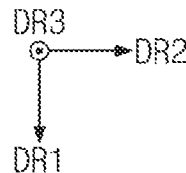

FIG. 5 is a plan view of a heat radiating member 200A according to some embodiments of the present disclosure.

Referring to FIG. 5, an inner space AS-1 of the heat radiating member 200A may include a plurality of divided spaces AS1 and AS2. The plurality of divided spaces AS1 and AS2 may include the first divided space AS1 and the second divided space AS2 spaced apart from the first divided space AS1 in the first direction DR1. The width WTx of the first divided space AS1 in the first direction DR1 may be smaller than the width WTy of the first divided space AS1 in the second direction DR2. That is, the width in a direction parallel to the direction of gravity may be smaller than the width in a direction different from (or perpendicular to) the direction of gravity.

A phase change material 210-1 may include a first phase change material 211 located in the first divided space AS1 and a second phase change material 212 located in the second divided space AS2. The volume of the first divided space AS1 may be greater than the volume of the first phase change material 211 in a solid state, and the volume of the second divided space AS2 may be greater than the volume of the second phase change material 212 in a solid state.

The heat radiating member 200A may further include a space separator 250 that is located between the first divided space AS1 and the second divided space AS2 and that extends in the second direction DR2 crossing the first direction DR1. The first divided space AS1 and the second divided space AS2 may be completely separated from each other by the space separator 250. Accordingly, each of the first phase change material 211 and the second phase change material 212 may not be moved into another divided space.

According to some embodiments of the present disclosure, the heat radiating member 200A includes the first divided space AS1 and the second divided space AS2. Accordingly, empty spaces may be divided and defined. For example, in a state in which the display device 1000 (refer to FIG. 1) is installed, the empty spaces may be defined at an upper end of the first divided space AS1 and an upper end of the second divided space AS2. Accordingly, the empty spaces may not be concentrated at the upper end of the display device 1000, and the heat radiating performance of the display device 1000 may be improved.

Although FIG. 5 illustrates one example that the heat radiating member 200A is divided into the two divided spaces AS1 and AS2 in the first direction DR1, embodiments according to the present disclosure are not particularly limited thereto. For example, the heat radiating member 200A may be divided into two or more regions in the first direction DR1. When a product, for example, the display device 1000 is in use, the first direction DR1 may be a direction parallel to the direction of gravity.

Figure 6A:
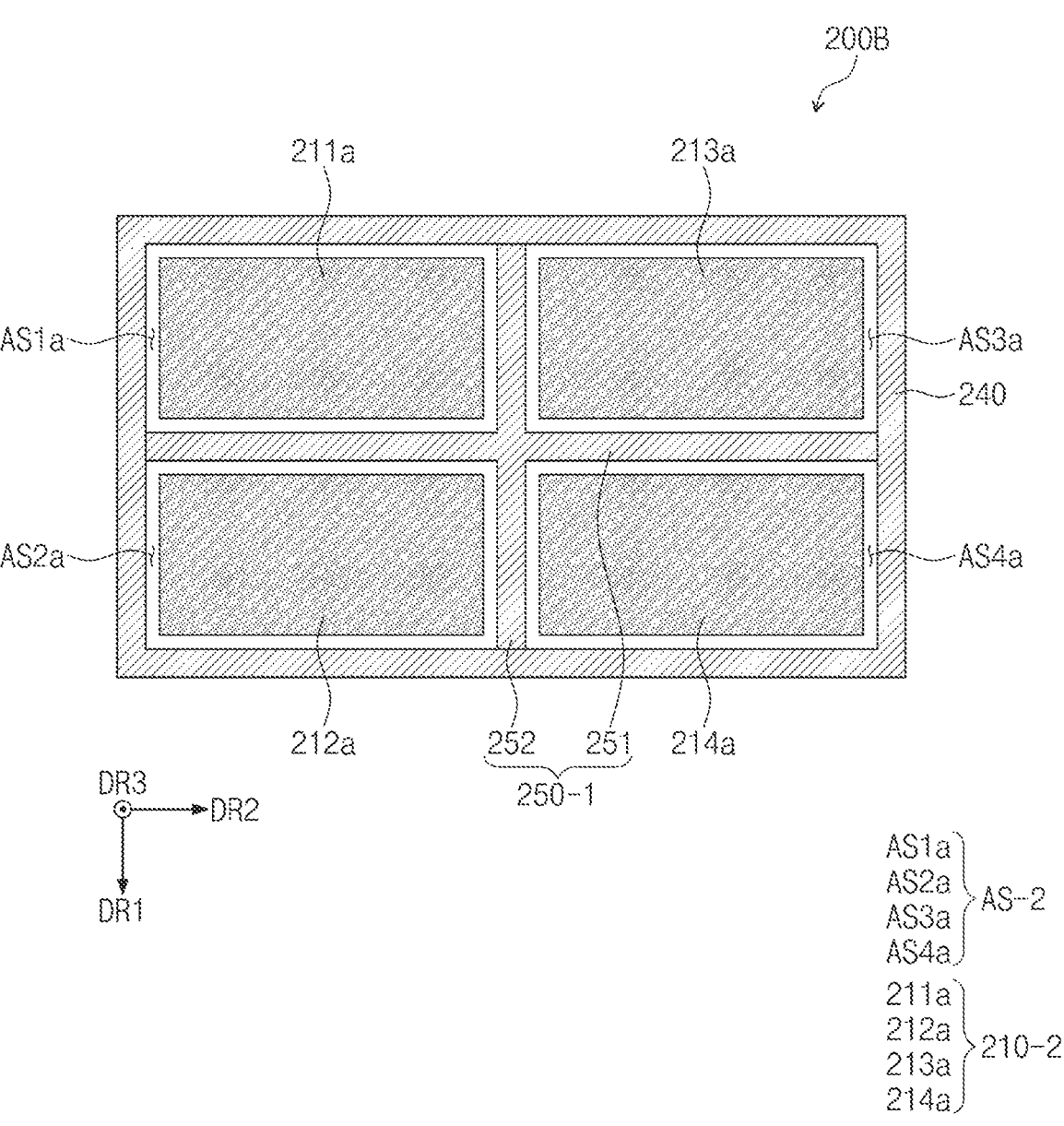
FIG. 6A is a plan view of a heat radiating member according to some embodiments of the present disclosure.
Figure 6B:
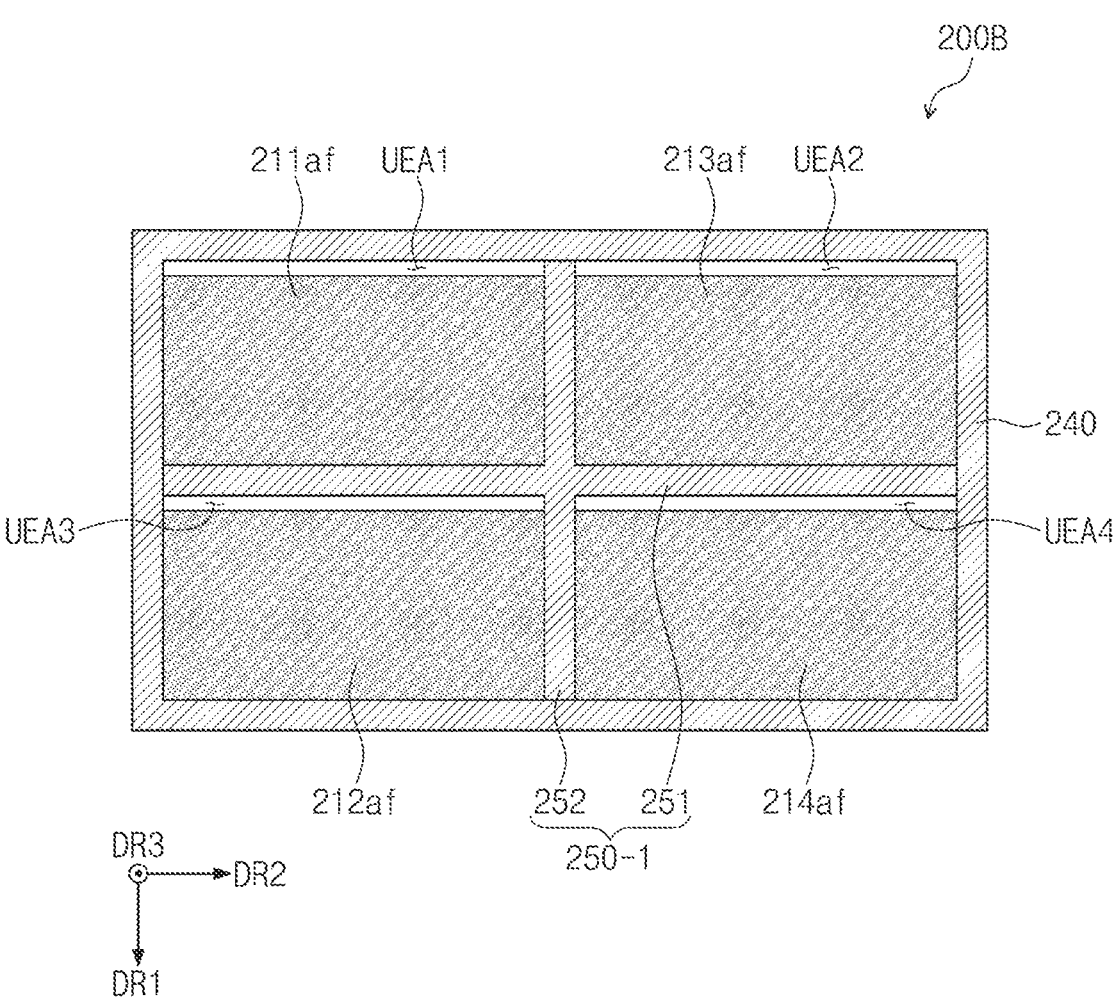
FIG. 6B is a plan view of the heat radiating member according to some embodiments of the present disclosure.

FIG. 6A is a plan view of a heat radiating member 200B according to some embodiments of the present disclosure. FIG. 6B is a plan view of the heat radiating member 200B according to some embodiments of the present disclosure.

Referring to FIGS. 6A and 6B, an inner space AS-2 of the heat radiating member 200B may include a plurality of divided spaces AS1a, AS2a, AS3a, and AS4a. The plurality of divided spaces AS1a, AS2a, AS3a, and AS4a may include the first divided space AS1a, the second divided space AS2a spaced apart from the first divided space AS1a in the first direction DR1, the third divided space AS3a spaced apart from the first divided space AS1a in the second direction DR2, and the fourth divided space AS4a spaced apart from the third divided space AS3a in the first direction DR1.

In FIGS. 6A and 6B, the first to fourth divided spaces AS1a, AS2a, AS3a, and AS4a are illustrated as having the same area on the plane, but are not particularly limited thereto. For example, the width of the second divided space AS2a in the first direction DR1 may be smaller than the width of the first divided space AS1a in the first direction DR1, and the width of the fourth divided space AS4a in the first direction DR1 may be smaller than the width of the second divided space AS2a in the first direction DR1. In this case, third and fourth empty spaces UEA3 and UEA4 defined in the second divided space AS2a and the fourth divided space AS4a may be located in lower positions than those illustrated in FIG. 6B.

A phase change material 210-2 may include a first phase change material 211*a* located in the first divided space AS1*a*, a second phase change material 212*a* located in the second divided space AS2*a*, a third phase change material 213*a* located in the third divided space AS3*a*, and a fourth phase change material 214*a* located in the fourth divided space AS4*a*.

The volume of the first divided space AS1*a* may be greater than the volume of the first phase change material 211*a* in a solid state, and the volume of the second divided space AS2*a* may be greater than the volume of the second phase change material 212*a* in a solid state. The volume of the third divided space AS3*a* may be greater than the volume of the third phase change material 213*a* in a solid state, and the volume of the fourth divided space AS4*a* may be greater than the volume of the fourth phase change material 214*a* in a solid state.

First to fourth empty spaces UEA1, UEA2, UEA3, and UEA4 corresponding to the first to fourth divided spaces AS1*a*, AS2*a*, AS3*a*, and AS4*a*, respectively, are illustrated in FIG. 6B. First to fourth phase change materials 211*af*, 212*af*, 213*af*, and 214*af* illustrated in FIG. 6B correspond to the first to fourth phase change materials 211*a*, 212*a*, 213*a*, and 214*a* liquefied and thereafter solidified.

The heat radiating member 200B may include a space separator 250-1 that divides the inner space AS-2 into the first to fourth divided spaces AS1*a*, AS2*a*, AS3*a*, and AS4*a*. The first to fourth divided spaces AS1*a*, AS2*a*, AS3*a*, and AS4*a* may be completely separated from each other by the space separator 250-1. Accordingly, each of the first to fourth phase change materials 211*a*, 212*a*, 213*a*, and 214*a* may not be moved into another divided space.

The space separator 250-1 may include a first space separator 251 that is located between the first divided space AS1*a* and the second divided space AS2*a* and between the third divided space AS3*a* and the fourth divided space AS4*a* and that extends in the second direction DR2 crossing the first direction DR1 and a second space separator 252 that is located between the first divided space AS1*a* and the third divided space AS3*a* and between the second divided space AS2*a* and the fourth divided space AS4*a* and that extends in the first direction DR1.

According to some embodiments of the present disclosure, empty spaces may be divided and defined in the heat radiating member 200B. For example, in a state in which the display device 1000 (refer to FIG. 1) is installed, the empty spaces may be defined at upper ends of the first to fourth divided spaces AS1*a*, AS2*a*, AS3*a*, and AS4*a*. Accordingly, the empty spaces may not be concentrated in a specific region of the display device 1000.

Although FIGS. 6A and 6B illustrate one example that the heat radiating member 200B is divided into the four divided spaces AS1*a*, AS2*a*, AS3*a*, and AS4*a* in the first direction DR1 and the second direction DR2, embodiments according to the present disclosure are not limited thereto. For example, the heat radiating member 200B may be divided into two or more regions in the first direction DR1 and may be divided into two or more regions in the second direction DR2.

Figure 7:
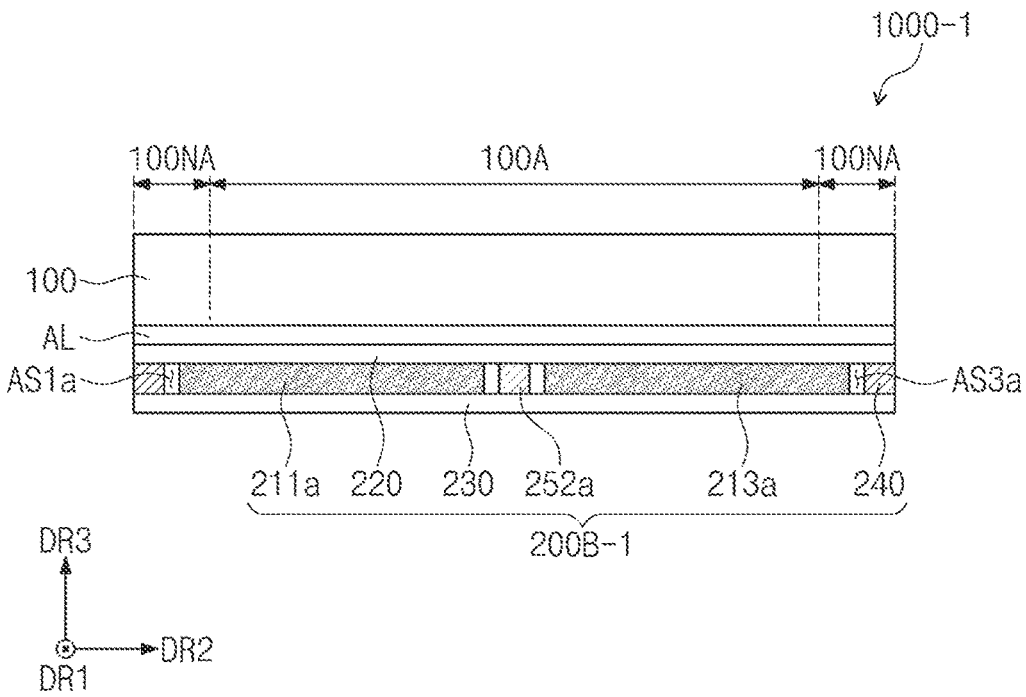
FIG. 7 is a sectional view of a display device according to some embodiments of the present disclosure.

FIG. 7 is a sectional view of a display device 1000-1 according to some embodiments of the present disclosure.

Referring to FIG. 7, the display device 1000-1 may include a display panel 100 and a heat radiating member 200B-1.

The heat radiating member 200B-1 may further include a partition wall 252*a*. The partition wall 252*a* may be coupled to a first plate 220 and a second plate 230.

The space separator 250 described above with reference to FIG. 5 may be provided in the form of the partition wall 252*a*. Furthermore, each of the first space separator 251 and the second space separator 252 of the space separator 250-1 described with reference to FIG. 6A may be provided in the form of the partition wall 252*a*.

FIG. 8 is a sectional view of a display device 1000-2 according to some embodiments of the present disclosure.

Referring to FIG. 8, the display device 1000-2 may include a display panel 100 and a heat radiating member 200B-2.

A second plate 231 of the heat radiating member 200B-2 may include a plurality of concave portions 231*cc*. In the case in which the second plate 231 includes the plurality of concave portions 231*cc*, mechanical stiffness may be improved. The plurality of concave portions 231*cc* may be referred to as a plurality of protruding portions, a plurality of protrusions, or a plurality of beads.

The second plate 231 may include two concave portions corresponding to the first and second divided spaces AS1 and AS2 illustrated in FIG. 5, or may include four concave portions corresponding to the first to fourth divided spaces AS1*a*, AS2*a*, AS3*a*, and AS4*a* illustrated in FIG. 6.

A portion 252*b* of the second plate 231 between the concave portions 231*cc* may be coupled to a first plate 220. The space separator 250 described above with reference to FIG. 5 may be the portion 252*b* of the second plate 231. Furthermore, each of the first space separator 251 and the second space separator 252 of the space separator 250-1 described with reference to FIG. 6A may also be the portion 252*b* of the second plate 231.

FIG. 9A is a sectional view of a display device 1000-3 according to some embodiments of the present disclosure. FIG. 9B is a plan view of a second plate 232 according to some embodiments of the present disclosure.

Referring to FIGS. 9A and 9B, the display device 1000-3 may include a display panel 100 and a heat radiating member 200C. The heat radiating member 200C may include a phase change material 210-3, a first plate 220, the second plate 232, and a coupling member 240.

The first plate 220 and the second plate 232 may define an inner space AS-3, and the inner space AS-3 may include a plurality of divided spaces AS1*b*, AS2*b*, AS3*b*, AS4*b*, and AS5*b*. The plurality of divided spaces AS1*b*, AS2*b*, AS3*b*, AS4*b*, and AS5*b* may be divided by the shape of the second plate 232.

The second plate 232 may include first to fourth protrusions HM1, HM2, HM3, and HM4 protruding in a direction away from the first plate 220. The first to fourth protrusions HM1, HM2, HM3, and HM4 may be referred to as a plurality of concave portions, a plurality of protruding portions, or a plurality of beads.

The plurality of divided spaces AS1*b*, AS2*b*, AS3*b*, AS4*b*, and AS5*b* may include the first divided space AS1*b* overlapping an entire region of a display region 100A, the second divided space AS2*b* defined in the first protrusion HM1, the third divided space AS3*b* defined in the second protrusion HM2, the fourth divided space AS4*b* defined in the third protrusion HM3, and the fifth divided space AS5*b* defined in the fourth protrusion HM4.

The phase change material 210-3 may include first to fifth phase change materials 211*b*, 212*b*, 213*b*, 214*b*, and 215*b* accommodated in the first to fifth divided spaces AS1*b*, AS2*b*, AS3*b*, AS4*b*, and AS5*b*, respectively. The first to fifth divided spaces AS1*b*, AS2*b*, AS3*b*, AS4*b*, and AS5*b* may be connected with each other. Accordingly, the first to fifth phase change materials 211*b*, 212*b*, 213*b*, 214*b*, and 215*b* may be moved into other divided spaces.

As the second plate 232 includes the first to fourth protrusions HM1, HM2, HM3, and HM4, the stiffness of the heat radiating member 200C may be improved. Furthermore, the display device 1000-3 may further include a driver board that drives the display panel 100, a set cover, and a stand, and the driver board, the set cover, and the stand may be attached or coupled to the heat radiating member 200C.

In addition, the phase change material 210-3 is accommodated in the first to fourth protrusions HM1, HM2, HM3, and HM4. Accordingly, the amount of the phase change material 210-3 included in the heat radiating member 200C may be increased. As the amount of the phase change material 210-3 is increased, the amount of heat that can be absorbed by the phase change material 210-3 may be increased. Thus, the heat radiating performance of the display device 1000-3 may be further improved.

On the plane, the first protrusion HM1 may include a first side S1 and a second side S2 spaced apart from the first side S1 in the first direction DR1. The first side S1 and the second side S2 may extend in the second direction DR2. The first length WT1 of the first side S1 in the second direction DR2 may be greater than the second length WT2 of the second side S2 in the second direction DR2. On the plane, the first protrusion HM1 may have an inverted trapezoidal shape. However, without being limited thereto, the first protrusion HM1 may have an irregular shape in which an upper portion is wider than a lower portion, or an inverted triangular shape.

An empty space may be defined at an upper end of the heat radiating member 200C by the gravity. According to some embodiments of the present disclosure, the uppermost first protrusion HM1 may have an inverted trapezoidal shape. Accordingly, even though the empty space exists at the upper end of the heat radiating member 200C due to the gravity, the area of a portion where the empty space and the display region 100A of the display panel 100 overlap each other may be decreased. For example, if the overlapping area between the empty space and the display region 100A is 10% when the heat radiating member 200 illustrated in FIG. 3 is applied, the overlapping area between the empty space and the display region 100A may be reduced to a level of 2% to 3% when the heat radiating member 200C illustrated in FIG. 9A is applied. The overlapping area may correspond to the ratio of the area of the region overlapping the empty space to the area of the display region 100A.

The second protrusion HM2 and the third protrusion HM3 may be defined between the first protrusion HM1 and the fourth protrusion HM4. In the first direction DR1, the second protrusion HM2 and the third protrusion HM3 may be closer to a central region of the display panel 100 than the first protrusion HM1 and the fourth protrusion HM4.

In the case of the display panel 100, even though an image having the same luminance, for example, an image of all white, all blue, or all red is displayed, the central region of the display panel 100 may have higher temperature distribution than an outer region due to the characteristics of natural convection and conduction. Accordingly, to suppress a temperature rise of a central portion of the display panel 100 by reflecting temperature characteristics of the display panel 100, the capacity of the phase change material 210-3 may be concentrated in the central portion.

For example, the gap DT1 between the second protrusion HM2 and the third protrusion HM3 may be smaller than the gap DT2 between the third protrusion HM3 and the fourth protrusion HM4. Accordingly, the capacity of the phase change material 210-3 may be further concentrated in the central portion of the display panel 100. According to some embodiments of the present disclosure, the widths of the second protrusion HM2 and the third protrusion HM3 in the first direction DR1 may be greater than the width of the fourth protrusion HM4 in the first direction DR1.

Although FIGS. 9A and 9B illustrate one example that the second plate 232 includes the first to fourth protrusions HM1, HM2, HM3, and HM4, embodiments according to the present disclosure are not particularly limited thereto. For example, the second plate 232 may include at least one of the first to fourth protrusions HM1, HM2, HM3, or HM4, or may include five or more protrusions.

FIG. 10 is a sectional view of a display device 1000-4 according to some embodiments of the present disclosure.

Referring to FIG. 10, the display device 1000-4 may include a display panel 100 and a heat radiating member 200D. The heat radiating member 200D may include a phase change material 210, a first plate 220, a second plate 233, and a coupling member 240.

The first plate 220 may have a flat shape, and the second plate 233 may have a curved shape. For example, the second plate 233 may be curved to have a shape protruding from the first plate 220.

The distance between the first plate 220 and the second plate 233 may be a first distance TK1 at a first point P1 and may be a second distance TK2 at a second point P2. The first distance TK1 and the second distance TK2 may differ from each other. For example, the second point P2 may be closer to a central portion of the display panel 100 than the first point P1, and the first distance TK1 may be smaller than the second distance TK2.

According to some embodiments of the present disclosure, to suppress a temperature rise of the central portion by reflecting temperature characteristics of the display panel 100, the capacity of the phase change material 210 may be concentrated in the central portion, and the width TKe of an outer portion of the heat radiating member 200D may not be increased. Accordingly, effective heat radiating performance may be secured while the design of reducing the thickness of an outer portion of the display device 1000-4 is satisfied.

An inner space AS of the heat radiating member 200D illustrated in FIG. 10 may be divided into a plurality of divided spaces. For example, as described with reference to FIG. 5, 6A, 7, 8, or 9A, the inner space AS of the heat radiating member 200D may be divided into a plurality of divided spaces.

FIG. 11 is a sectional view of a display device 1000-5 according to some embodiments of the present disclosure.

Referring to FIG. 11, the display device 1000-5 may include a display panel 100-C and a heat radiating member 200E. The heat radiating member 200E may include a phase change material 210, a first plate 220-C, a second plate 230-C, and a coupling member 240-C.

The display panel 100-C may have a curved shape. For example, the display panel 100-C may be a curved display panel 100-C having a concave display surface. However, embodiments according to the present disclosure are not particularly limited thereto. For example, the display panel 100-C may be a curved display panel 100-C having a convex display surface.

The first plate 220-C and the second plate 230-C may have a curved shape to correspond to the display panel 100-C. For example, the radius of curvature of the first plate 220-C may be smaller than the radius of curvature of the second plate 230-C. Accordingly, the curvature of the first plate 220-C may be greater than the curvature of the second plate 230-C.

The distance between the first plate 220-C and the second plate 230-C may be substantially the same in all regions. For example, the distance between the first plate 220-C and the second plate 230-C may be a first distance TK1$a$ at a first point P1$a$ and may be a second distance TK2$a$ at a second point P2$a$. The first distance TK1$a$ and the second distance TK2$a$ may be substantially the same as each other.

An inner space AS of the heat radiating member 200E illustrated in FIG. 11 may be divided into a plurality of divided spaces. For example, as described with reference to FIG. 5, 6A, 7, 8, or 9A, the inner space AS of the heat radiating member 200E may be divided into a plurality of divided spaces.

FIG. 12 is a sectional view of a display device 1000-6 according to some embodiments of the present disclosure.

Referring to FIG. 12, the display device 1000-6 may include a display panel 100-C and a heat radiating member 200F. The heat radiating member 200F may include a phase change material 210, a first plate 220-C, a second plate 230-Ca, and a coupling member 240-Ca.

The first plate 220-C may have a curved shape to correspond to the display panel 100-C. The second plate 230-Ca may be more curved than the first plate 220-C. For example, the radius of curvature of the first plate 220-C may be greater than the radius of curvature of the second plate 230-C. Accordingly, the second curvature of the second plate 230-Ca may be greater than the first curvature of the second plate 230-C.

The distance between the first plate 220-C and the second plate 230-Ca may be a first distance TK1$b$ at a first point P1$b$ and may be a second distance TK2$b$ at a second point P2$b$. The first distance TK1$b$ and the second distance TK2$b$ may differ from each other. For example, the second point P2$b$ may be closer to a central portion of the display panel 100-C than the first point P1$b$, and the first distance TK1$b$ may be smaller than the second distance TK2$b$.

According to some embodiments of the present disclosure, to suppress a temperature rise of the central portion by reflecting temperature characteristics of the display panel 100-C, the capacity of the phase change material 210 may be concentrated in the central portion, and the width TKea of an outer portion of the heat radiating member 200F may not be increased. Accordingly, effective heat radiating performance may be secured while the design of reducing the thickness of an outer portion of the display device 1000-6 is satisfied.

An inner space AS of the heat radiating member 200F illustrated in FIG. 12 may be divided into a plurality of divided spaces. For example, as described with reference to FIG. 5, 6A, 7, 8, or 9A, the inner space AS of the heat radiating member 200F may be divided into a plurality of divided spaces.

FIG. 13 is a sectional view of a first plate 220$x$ according to some embodiments of the present disclosure.

Referring to FIG. 13, the first plate 220$x$ may have a multi-layer structure including a first plate layer 221 and a second plate layer 222. For example, the first plate layer 221 may be a base layer, for example, a plastic plate. The second plate layer 222 may be a graphite sheet. However, this is illustrative, and the material of the first plate layer 221 and the material of the second plate layer 222 are not limited thereto.

The first plate 220$x$ may be applied to the first plates of the above-described heat radiating members. In this case, the second plate layer 222 may be located adjacent to the display panel 100 (refer to FIG. 2). According to some embodiments of the present disclosure, the first plate 220$x$ illustrated in FIG. 13 may be applied to the above-described second plates. Alternatively, the first plate 220$x$ may be applied to both the first plates and the second plates described above.

As described above, the heat radiating member may include the phase change material. Heat generated from the display panel may be transferred to the phase change material. The phase change material may absorb the heat of the display panel. Thus, the temperature of the display device may be suppressed from being raised to the phase change temperature or more despite a long period of operation.

Furthermore, the inner space of the heat radiating member may include the plurality of divided spaces. The empty spaces in the inner space that are defined depending on a change of the phase change material may not be concentrated in a specific region. Thus, the heat radiating performance of the display device may be improved.

Moreover, the protrusions in which the phase change material is accommodated may be defined on the heat radiating member. In particular, the protrusions may have an inverted trapezoidal shape. In this case, even though an empty space exists at the upper end of the heat radiating member due to the gravity, the area of a portion where the empty space and the display region of the display panel overlap each other may be decreased. Thus, the heat radiating performance of the display device may be improved.

In addition, to suppress a temperature rise of the central portion by reflecting temperature characteristics of the display panel, the heat radiating member may have the structure that allows the capacity of the phase change material to be concentrated in the central portion. In this case, the width of the outer portion of the heat radiating member may not be increased while the capacity of the phase change material is concentrated in the central portion. Thus, effective heat radiating performance may be secured while the design of reducing the thickness of the outer portion of the display device is satisfied.

While the present disclosure has been described with reference to embodiments thereof, it will be apparent to those of ordinary skill in the art that various changes and modifications may be made thereto without departing from the spirit and scope of the present disclosure as set forth in the following claims, and their equivalents.

What is claimed is:

1. A display device comprising:
a display panel having a display region and a non-display region; and
a heat radiating member attached to the display panel,
wherein the heat radiating member includes:
a first plate facing the display panel;
a second plate configured to face the first plate and defining an inner space with the first plate; and
a phase change material in the inner space, and
wherein the inner space includes a plurality of divided spaces, and the phase change material is in the plurality of divided spaces,
wherein the plurality of divided spaces include a first divided space, a second divided space spaced apart from the first divided space in a first direction, a third divided space spaced apart from the first divided space in a second direction crossing the first direction, and a fourth divided space spaced apart from the third divided space in the first direction.

2. The display device of claim 1,
wherein the phase change material includes a first phase change material in the first divided space and a second phase change material in the second divided space, and
wherein the first divided space has a larger volume than the first phase change material in a solid state, and the second divided space has a larger volume than the second phase change material in a solid state.

3. The display device of claim 2, wherein the heat radiating member further includes a first partition wall between the first divided space and the second divided space and configured to extend in the second direction crossing the first direction, and wherein the first partition wall is coupled to the first plate and the second plate.

4. The display device of claim 2, wherein the second plate includes a first concave portion configured to define the first divided space and a second concave portion configured to define the second divided space, and a portion of the second plate between the first concave portion and the second concave portion is coupled to the first plate.

5. The display device of claim 2, wherein the phase change material further includes a third phase change material in the third divided space and a fourth phase change material in the fourth divided space, the third divided space has a larger volume than the third phase change material in a solid state, and the fourth divided space has a larger volume than the fourth phase change material in a solid state.

6. The display device of claim 2, wherein a width of the first divided space in the first direction is smaller than a width of the first divided space in a second direction crossing the first direction.

7. The display device of claim 1, wherein an entire region of the display region overlaps the inner space in a plan view.

8. The display device of claim 1, wherein the plurality of divided spaces are completely separated from each other.

9. The display device of claim 1, wherein the plurality of divided spaces are connected together and divided by a shape of the second plate.

10. The display device of claim 1, wherein the first plate has a flat shape, and the second plate has a curved shape.

11. The display device of claim 1, wherein a distance between the first plate and the second plate is the same in all regions.

12. The display device of claim 1, wherein a distance between the first plate and the second plate is a first distance at a first point and a second distance greater than the first distance at a second point spaced apart from the first point.

13. The display device of claim 1, wherein the display panel has a curved shape, the first plate has a curved shape with a first curvature, and the second plate has a curved shape with a second curvature greater than the first curvature.

14. The display device of claim 1, wherein a first protrusion configured to protrude in a direction away from the first plate is defined on the second plate, and the phase change material is accommodated in the first protrusion.

15. A display device comprising:

a display panel having a display region and a non-display region; and a heat radiating member attached to the display panel, wherein the heat radiating member includes:

a first plate facing the display panel;

a second plate configured to face the first plate and defining an inner space with the first plate; and a phase change material in the inner space, and wherein the inner space includes a plurality of divided spaces, and the phase change material is in the plurality of divided spaces, wherein a first protrusion configured to protrude in a direction away from the first plate is defined on the second plate, and the phase change material is accommodated in the first protrusion, wherein when viewed along a thickness direction of the display panel, the first protrusion includes a first side and a second side spaced apart from the first side in a first direction, and the first side and the second side extend in a second direction crossing the first direction, and wherein a first length of the first side in the second direction is greater than a second length of the second side in the second direction.

16. The display device of claim 15, when viewed along a thickness direction of the display panel, the first protrusion has an inverted trapezoidal shape.

17. The display device of claim 15, wherein a second protrusion configured to protrude in a direction away from the first plate and spaced apart from the first protrusion in a first direction, a third protrusion spaced apart from the second protrusion in the first direction, and a fourth protrusion spaced apart from the third protrusion in the first direction are further defined on the second plate, and the phase change material is accommodated in each of the second protrusion, the third protrusion, and the fourth protrusion.

18. The display device of claim 17, wherein the second protrusion and the third protrusion are defined between the first protrusion and the fourth protrusion, and a gap between the second protrusion and the third protrusion is greater than a gap between the third protrusion and the fourth protrusion.

* * * * *